(12) United States Patent
Choi

(10) Patent No.: US 9,709,864 B2
(45) Date of Patent: Jul. 18, 2017

(54) ARRAY SUBSTRATE AND ITS MANUFACTURING METHOD AND DISPLAY DEVICE

(71) Applicant: BOE TECHNOLOGY GROUP CO., LTD., Beijing (CN)

(72) Inventor: Seungjin Choi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/784,750

(22) PCT Filed: May 4, 2015

(86) PCT No.: PCT/CN2015/078203
§ 371 (c)(1),
(2) Date: Oct. 15, 2015

(87) PCT Pub. No.: WO2016/107039
PCT Pub. Date: Jul. 7, 2016

(65) Prior Publication Data
US 2016/0306241 A1   Oct. 20, 2016

(30) Foreign Application Priority Data

Jan. 4, 2015   (CN) .......................... 2015 1 0004123

(51) Int. Cl.
*H01L 27/12* (2006.01)
*H01L 27/32* (2006.01)
(Continued)

(52) U.S. Cl.
CPC .... *G02F 1/136209* (2013.01); *G02F 1/13439* (2013.01); *G02F 1/133345* (2013.01);
(Continued)

(58) Field of Classification Search
CPC ......... G02F 1/133512; G02F 1/133514; G02F 1/133555; G02F 1/133; G02F 1/136;
(Continued)

(56) References Cited

U.S. PATENT DOCUMENTS

| 6,424,086 B1 * | 7/2002 | Odaka ..................... H01J 29/28 313/466 |
| 9,110,327 B2 | 8/2015 | Wang et al. |

(Continued)

FOREIGN PATENT DOCUMENTS

| CN | 101515081 A | 8/2009 |
| CN | 102681245 A | 9/2012 |

(Continued)

OTHER PUBLICATIONS

International Search Report of PCT/CN2015/078203 in Chinese, mailed Aug. 5, 2015 with English translation.
(Continued)

*Primary Examiner* — Fazli Erdem
(74) *Attorney, Agent, or Firm* — Collard & Roe, P.C.

(57) ABSTRACT

An array substrate and its manufacturing method, and a display device are disclosed, and the array substrate includes a black matrix (200) disposed on a base substrate (100) and has a plurality of pixel units arranged in an array, the orthographic projection of the pattern of the black matrix (200) on the base substrate at least partially covers the gap between adjacent pixel units, and the surface of at least a portion of the black matrix (200) has a first concave-convex structure (A) capable of reflecting the light irradiated to the surface of the black matrix (200) in diffuse reflection. Because the first concave-convex structure (A) of the surface of the black matrix (200) has a diffuse reflection effect, the external light will be subjected to diffuse reflection when irradiated to the surface of the black matrix (200), thereby (Continued)

reducing the light intensity of the reflected light, enhancing the visibility of the area of each of the pixel units of the array substrate, and improving the display effect of picture.

19 Claims, 5 Drawing Sheets

(51) Int. Cl.

| | | |
|---|---|---|
| *H01L 51/52* | (2006.01) | |
| *G02F 1/133* | (2006.01) | |
| *G02F 1/136* | (2006.01) | |
| *G02F 1/1362* | (2006.01) | |
| *G02F 1/1333* | (2006.01) | |
| *G02F 1/1335* | (2006.01) | |
| *G02F 1/1343* | (2006.01) | |

(52) U.S. Cl.
CPC .. *G02F 1/133504* (2013.01); *G02F 1/133514* (2013.01); *G02F 1/133553* (2013.01); *G02F 1/134336* (2013.01); *H01L 27/1218* (2013.01); *H01L 27/1262* (2013.01); *H01L 27/3246* (2013.01); *H01L 51/5284* (2013.01); *G02F 2201/121* (2013.01); *G02F 2201/123* (2013.01); *H01L 27/3244* (2013.01)

(58) Field of Classification Search
CPC ......... G02F 1/136209; G02F 1/133345; G02F 1/133504; G02F 1/133553; G02F 1/134336; G02F 1/13439; H01L 27/12; H01L 27/32; H01L 27/1218; H01L 27/1262; H01L 27/3246; H01L 51/52; H01L 51/5284
See application file for complete search history.

(56) References Cited

U.S. PATENT DOCUMENTS

| | | | |
|---|---|---|---|
| 9,285,641 B2* | 3/2016 | Kim .................. | G02F 1/136209 |
| 2003/0117059 A1* | 6/2003 | Koo .................... | H01L 27/3265 |
| | | | 313/422 |
| 2003/0193284 A1* | 10/2003 | Park .................... | H01L 27/3244 |
| | | | 313/504 |
| 2004/0070709 A1* | 4/2004 | Kanou .............. | G02F 1/133553 |
| | | | 349/113 |
| 2005/0270446 A1* | 12/2005 | Kim .................. | G02F 1/136209 |
| | | | 349/110 |
| 2009/0152555 A1 | 6/2009 | Park et al. | |
| 2010/0038648 A1* | 2/2010 | Cho .................. | G02F 1/136227 |
| | | | 257/72 |
| 2011/0141413 A1* | 6/2011 | Sakai ..................... | G02B 5/003 |
| | | | 349/110 |
| 2011/0248155 A1* | 10/2011 | Chen ...................... | G02B 5/201 |
| | | | 250/226 |
| 2014/0054581 A1 | 2/2014 | Song et al. | |
| 2014/0293182 A1* | 10/2014 | Kim .................. | G02F 1/136209 |
| | | | 349/43 |
| 2015/0340412 A1* | 11/2015 | Lee .......................... | H01L 51/56 |
| | | | 257/88 |
| 2015/0362794 A1* | 12/2015 | Pang ................. | G02F 1/133514 |
| | | | 359/891 |
| 2016/0131930 A1* | 5/2016 | Sun .................... | G02F 1/136227 |
| | | | 349/43 |

FOREIGN PATENT DOCUMENTS

| | | |
|---|---|---|
| CN | 102681276 A | 9/2012 |
| CN | 104102052 A | 10/2014 |
| CN | 104536194 A | 4/2015 |
| CN | 204302626 U | 4/2015 |
| CN | 104733456 A | 6/2015 |

OTHER PUBLICATIONS

Notice of Transmittal of the International Search Report of PCT/CN2015/078203 in Chinese, mailed Aug. 4, 2015.
Written Opinion of the International Searching Authority of PCT/CN2015/078203 in Chinese, mailed Aug. 4, 2015 with English translation.
Chinese Office Action in Chinese Application No. 201510004123.7, mailed Dec. 1, 2016 with English translation.
Second Chinese Office Action in Chinese Application No. 201510004123.7, mailed Apr. 24, 2017 with English translation.

* cited by examiner

ARRAY SUBSTRATE AND ITS MANUFACTURING METHOD AND DISPLAY DEVICE

CROSS REFERENCE TO RELATED APPLICATIONS

This application is the National Stage of PCT/CN2015/078203 filed on May 4, 2015, which claims priority under 35 U.S.C. §119 of Chinese Application No. 201510004123.7 filed on Jan. 4, 2015, the disclosure of which is incorporated by reference.

TECHNICAL FIELD

Embodiments of the present invention relate to an array substrate and its manufacturing method, and a display device.

BACKGROUND

An array substrate is a key component of a display panel. Currently, a color filter layer is directly formed on an array substrate in color-filter on array (referred to as COA) technology, and this technology can avoid alignment errors and reduce the difficulty of the assembling process during the preparation of a display panel, and is therefore widely used.

However, the structure having reflective properties on a COA display substrate reduces the readability of the picture of a display area. Therefore, how to improve the anti-light interference performance of a display substrate is a technical problem to be addressed by a person skilled in the art.

SUMMARY

At least one embodiment of the present invention provides an array substrate and its manufacturing method, and a display device, which can diffuse the external light upon it entering a liquid crystal panel from the outside and being irradiated to the surface of a black matrix, so as to reduce the light intensity of the reflected light, thereby improving the visibility of the area of each of the pixel units of the array substrate.

At least one embodiment of the present invention provides an array substrate, comprising: a base substrate and a black matrix disposed on the base substrate; the array substrate comprises a plurality of pixel units arranged in an array, the orthographic projection of the pattern of the black matrix on the base substrate at least partially covers a gap between adjacent pixel units, and a surface of at least a portion of the black matrix comprises a first concave-convex structure capable of reflecting the light irradiated to the surface of the black matrix in diffuse reflection.

The above array substrate provided in at least one embodiment of the present invention further comprises an insulation layer disposed below and in direct contact with the black matrix, the surface of the insulation layer comprising a second concave-convex structure matching the first concave-convex structure of the surface of the black matrix.

In the above array substrate provided in at least one embodiment of the present invention, the material of the black matrix is, for example, a metal material.

The above array substrate provided in at least one embodiment of the present invention further comprises a slit-shaped first electrode disposed in the area of each of the pixel units on the base substrate, the first electrode being made of the same material and disposed in the same layer as the black matrix.

The above array substrate provided in at least one embodiment of the present invention further comprises a second electrode disposed in the area of each of the pixel units on the base substrate, the second electrode being insulated from the first electrode via the insulation layer.

In the above array substrate provided in at least one embodiment of the present invention, the second electrode is a planar electrode or a slit electrode.

In the above array substrate provided in at least one embodiment of the present invention, the orthographic projections of the first electrode and the second electrode on the base substrate at least partially overlap with each other.

In the above array substrate provided in at least one embodiment of the present invention, the first electrode is a common electrode and the second electrode is a pixel electrode; or the first electrode is a pixel electrode and the second electrode is a common electrode.

In the above array substrate provided in at least one embodiment of the present invention, the insulation layer is a color filter layer comprising filters of at least three different colors.

In the above array substrate provided in at least one embodiment of the present invention, the first concave-convex structure has a width of 3 to 6 microns; and/or the first concave-convex structure has a depth of 0.5 to 1.5 microns; and/or the first concave-convex structure has an interval of 3 to 6 microns.

At least one embodiment of the present invention further provides a display device, comprising the above array substrate provided in any embodiment of the present invention.

At least one embodiment of the present invention further provides a method of manufacturing the above array substrate, comprising: forming a plurality of pixel units arranged in an array on a base substrate and forming a pattern of a black matrix which at least partially covers a gap between adjacent pixel units, the surface of at least a portion of the pattern of the black matrix comprising a first concave-convex structure capable of reflecting the light irradiated to the surface of the black matrix in diffuse reflection.

In the method of manufacturing the above array substrate provided in at least one embodiment of the present invention, forming the pattern of the black matrix on the base substrate, for example, comprises: forming on the base substrate a pattern of an insulation layer comprising a second concave-convex structure; forming a metal layer on the insulation layer; patterning the metal layer by a patterning process to form the pattern of the black matrix with at least a portion of the surface thereof comprising a first concave-convex structure at the gap between adjacent pixel units and to form a pattern of a first electrode in the area of each of the pixel units.

The method of manufacturing the above array substrate provided in at least one embodiment of the present invention, for example, comprises: forming on a base substrate a pattern of a second electrode in the area of each of the pixel units prior to forming on the base substrate the pattern of the insulation layer comprising a second concave-convex structure. A color filter layer comprising filters of at least three different colors is formed on the pattern of the second electrode, the filter layer comprising a second concave-convex structure.

BRIEF DESCRIPTION OF THE DRAWINGS

In order to illustrate the technical solutions of the embodiments of the present invention more clearly, the drawings of the embodiments are simply described below. Apparently, the drawings described below relate to only some embodiments of the present invention but are not limitative of the present invention.

DETAILED DESCRIPTION

Figure 1A:
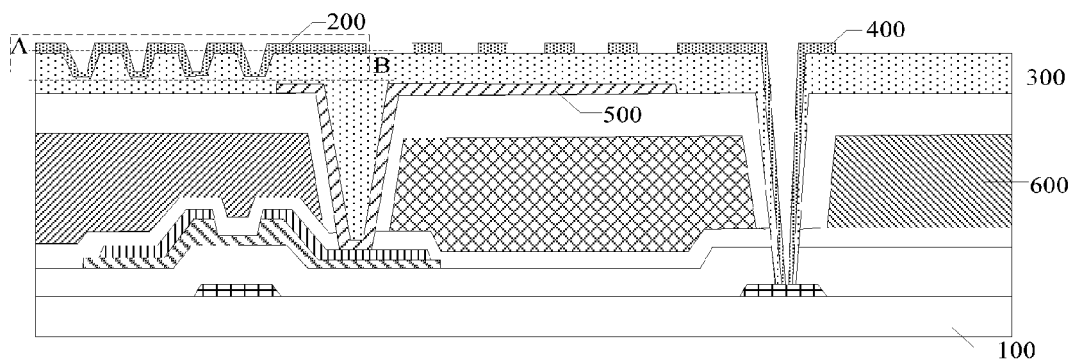
FIG. 1a to FIG. 1d are respectively structural schematic views of an array substrate according to an embodiment of the present invention.

To make clearer the object, technical solutions and advantages of the embodiments of the present invention, a clear and full description of the technical solutions of the embodiments of the present invention will be made with reference to the accompanying drawings of the embodiments of the present invention. Obviously, the embodiments described are merely part of the embodiments of the present invention, but not all the embodiments. Based on the embodiments of the present invention described, all the other embodiments acquired by a person of ordinary skill in the art, without any creative labor, fall within the scope of protection of the present invention.

The thickness and shape of the various film layers in the drawings do not reflect the actual scale of the array substrate, and their purpose is only to illustrate rather than limit the content of the present invention.

At least one embodiment of the present invention provides an array substrate, as illustrated in FIG. 1a to FIG. 1d, comprising: a base substrate 100 and a black matrix 200 disposed on the base substrate 100. The array substrate comprises, for example, a plurality of pixel units defined by gate lines and data lines which intersect with each other and arranged in an array. The orthographic projection of the pattern of the black matrix 200 on the base substrate 100 at least partially covers the gap between adjacent pixel units. For example, the orthographic projection of the black matrix 200 covers the gate lines and data lines of the array substrate and can further cover at least the region where the channel is to be formed in thin film transistor (TFT).

The surface of at least a portion of the black matrix 200 has a first concave-convex structure A capable of reflecting the light irradiated to the surface of the black matrix 200 in diffuse reflection.

Because the first concave-convex structure A of the surface of the black matrix 200 has a diffuse reflection effect, the external light will be reflected in diffuse reflection when irradiated to the surface of the black matrix 200, which reduces the light intensity of the reflected light, enhances the visibility of the area of each of the pixel units of the array substrate, and improves the display effect of picture.

In at least one embodiment of the present invention, in order to further enable the surface of the black matrix to form a first concave-convex structure capable of diffuse reflection, as illustrated in FIG. 1a to FIG. 1d, the array substrate may further comprise: an insulation layer 300 disposed below and in direct contact with the black matrix 200, the surface of the insulation layer 300 having a second concave-convex structure B which matches the first concave-convex structure A of the surface of the black matrix 200. In this case, the second concave-convex structure B of the surface of the insulation layer 300 and the first concave-convex structure A of the surface of the black matrix 200 are closely fitted with each other, for example, they are conformal. In the production process of the array substrate, a pattern of an insulation layer 300 having a second concave-convex structure B is first formed on a base substrate, which is helpful for forming a pattern of a black matrix 200, which has a first concave-convex structure A in surface, by the next patterning process and allow the external light irradiated to the surface of the black matrix 200 to be subjected to diffuse reflection.

In at least one embodiment of the invention, the width of the first concave-convex structure (the width of the cross-section of the concave-convex structure in FIG. 1a) can be set as 3 to 6 microns, where the specific width depends on different conditions and will not be limited herein.

In at least one embodiment of the present invention, the depth of the first concave-convex structure (the depth of the surface with respect to the array substrate in FIG. 1a) can be set as 0.5 to 1.5 microns, where the specific depth depends on different conditions and will not be limited herein.

In at least one embodiment of the invention, the interval in the first concave-convex structure can be set as 3 to 6 microns, where the specific interval depends on different conditions and will not be limited herein.

In at least one embodiment of the invention, the material of the black matrix 200 can be selected as a conductive metal material, which can not only block the light emitted by the backlight module in a display panel so as to prevent color mixing and light leakage, but also reflect external light.

In at least one embodiment of the present invention, as illustrated in FIG. 1a to FIG. 1d, the array substrate may further comprise: a slit-shaped first electrode 400 disposed in the area of each of the pixel units on a base substrate 100. In order to simplify the production process of the array substrate, for example, the first electrode 400 can be made of the same material and disposed in the same layer as the black matrix 200. As such, in the production process of the array substrate, for example, a pattern of the black matrix 200 and a pattern of the first electrode 400 can be formed at the same time by a patterning process on a metal film, i.e., two patterns are formed in a single patterning process. This, as a result, simplifies the production process and reduces the production cost.

In at least one embodiment of the present invention, as illustrated in FIG. 1a to FIG. 1d, the array substrate may further comprise: a second electrode 500 disposed in the area of each of the pixel units on a base substrate 100. The second electrode 500 is insulated from the first electrode 400 via an insulation layer 300. That is, their relationship is that the second electrode 500, the insulation layer 300 and the first electrode 400 are sequentially disposed on the base substrate 100 of the array substrate, which is effective for display control. In this case, the insulation layer 300 serves to separate the second electrode 500 from the first electrode 400.

Figure 1B:
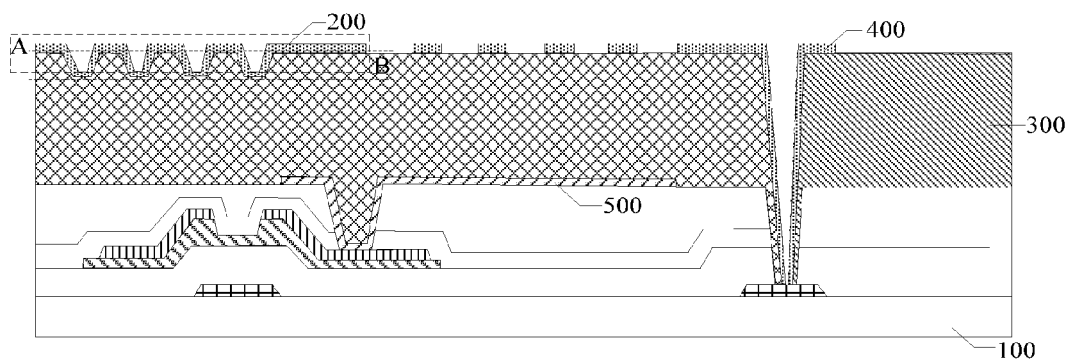
Figure 1C:
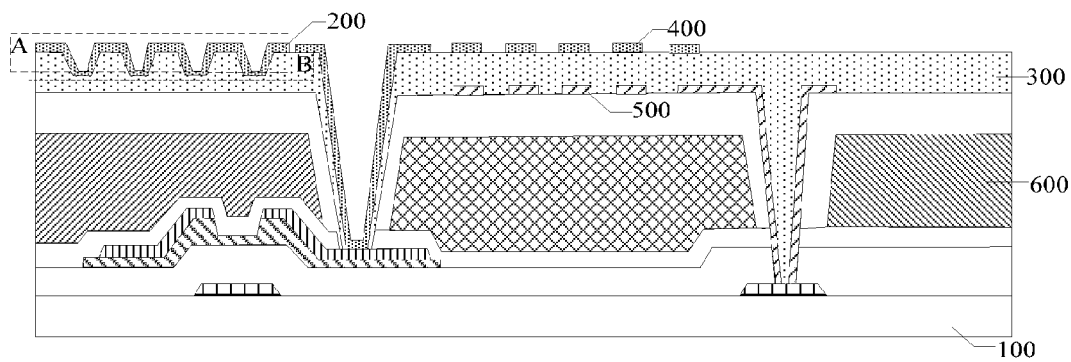
Figure 1D:
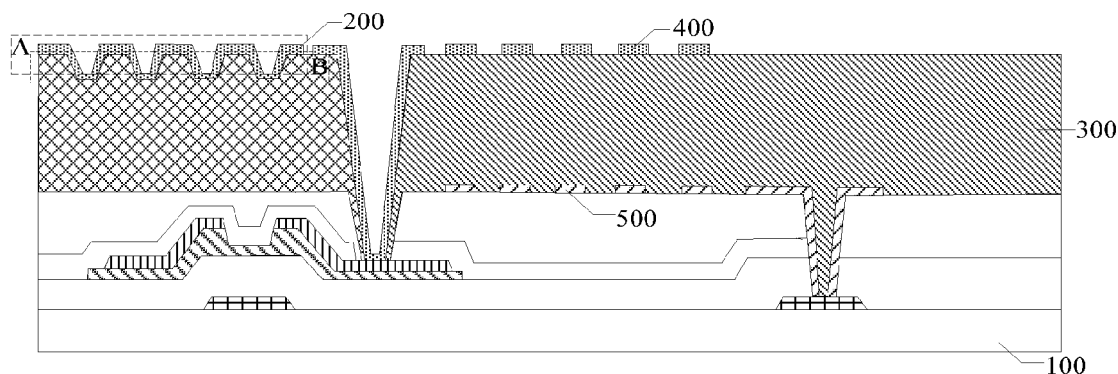

In at least one embodiment of the invention, as illustrated in FIG. 1a and FIG. 1b, the second electrode 500 is a planar electrode, i.e., it is formed into a complete planar pattern such as a rectangle or a parallelogram, or as illustrated in FIG. 1c and FIG. 1d, the second electrode 500 is a slit electrode, comprising a plurality of slits, for example, parallel to each other.

In at least one embodiment of the invention, as illustrated in FIG. 1a to FIG. 1d, the orthographic projections of the first electrode 400 and the second electrode 500 on the base substrate at least partially overlap with each other.

In at least one embodiment of the present invention, according to different display modes of the display panel, as illustrated in FIG. 1a and FIG. 1b, if the first electrode 400 is set as a common electrode, the second electrode 500 is typically set as a pixel electrode; alternatively, as illustrated in FIG. 1c and FIG. 1d, if the first electrode 400 is set as a pixel electrode, the second electrode 500 is typically set as a common electrode. The setting of the pixel electrode and the common electrode can be determined by the specific display modes of the display panel according to actual needs.

In at least one embodiment of the present invention, the color filter layer comprising filters of at least three different colors is generally disposed between a base substrate and a second electrode, and the filters of different colors are respectively used to allow light of different colors to pass therethrough. As illustrated in FIG. 1a and FIG. 1c, a color filter layer 600 is disposed between a base substrate 100 and a second electrode 500, i.e., the color filter layer 600 is provided independently. In order to reduce the thickness of the array substrate and simplify the production process of the array substrate, in at least one embodiment of the invention, the insulation layer may be set as a color filter layer comprising filters of at least three different colors. As illustrated in FIG. 1b and FIG. 1d, the color filter layer comprising filters of at least three different colors is disposed between a first electrode 400 and a second electrode 500, i.e., the color filter layer is used directly as an insulation layer 300, which reduces the thickness of the array substrate and simplifies the production process of the array substrate.

The array substrate in at least one embodiment of the present invention can be used in, for example, a liquid crystal display device, an organic light-emitting diode (OLED) display device, an electronic paper display device or the like. When applied in an organic light-emitting diode (OLED) display device, the array substrate may have additional film layer structures such as a light-emitting layer, a cathode, an anode, and the like, and structures such as a thin film transistor, a gate line, a data line, a common electrode line and the like can also be formed on the base substrate. Such specific structures can be achieved by various manners, which are not defined herein.

At least one embodiment of the invention further provides a method of manufacturing the above array substrate. Since the principle of the method for solving the problem is similar to that of the preceding array substrate, reference can be made to the preceding array substrate for the implementation of the method, and it is unnecessary to repeat the details here.

The method of manufacturing an array substrate provided in at least one embodiment of the present invention comprises: forming a plurality of pixel units arranged in an array on a base substrate and a pattern of a black matrix which at least partially covers the gap between adjacent pixel units.

The surface of at least a portion of the pattern of the black matrix has a first concave-convex structure capable of reflecting the light irradiated to the surface of the black matrix in diffuse reflection. Since the first concave-convex structure A of the surface of the black matrix 200 has a diffuse reflection effect, the external light will be subjected to diffuse reflection when irradiated to the surface of the black matrix 200, thereby reducing the light intensity of the reflected light, enhances the visibility of the area of each of the pixel units of the array substrate, and improves the display effect of picture.

Figure 2:
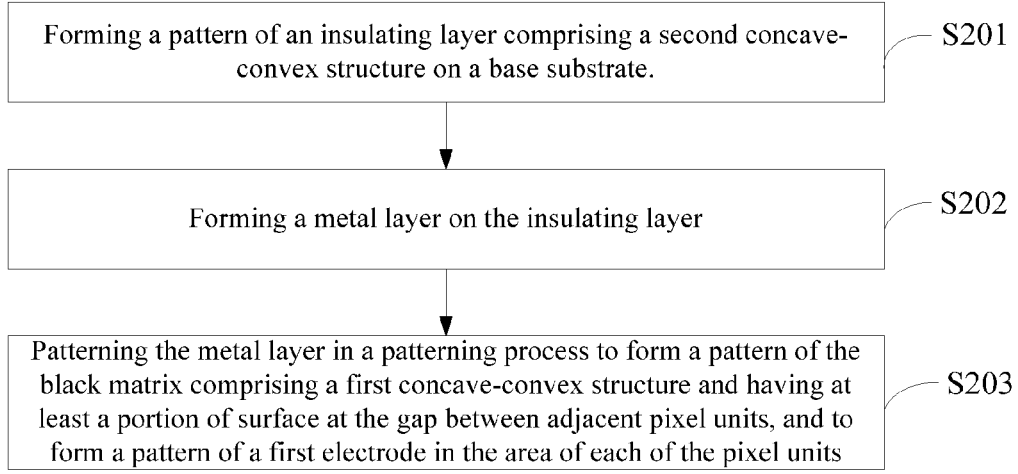
FIG. 2 is a flow chart of a method of manufacturing a black matrix in the array substrate according to an embodiment of the present invention.

In at least one embodiment of the present invention, a pattern of a black matrix is formed on a base substrate, which, as illustrated in FIG. 2, can be achieved by the following modes:

S201. Forming a pattern of an insulation layer having a second concave-convex structure on a base substrate. For example, the second concave-convex structure of the surface of the insulation layer matches the first concave-convex structure of the surface of the black matrix to be formed; for forming the pattern of the insulation layer having the second concave-convex structure, there are many preparation methods, which will not be limited herein.

S202. Forming a metal layer on the insulation layer. The metal layer can be made of various metal materials or alloy materials, such as aluminum, aluminum alloy, copper, copper alloy, and the like.

S203. Patterning the metal layer in a patterning process to form a pattern of the black matrix comprising a first concave-convex structure and having at least a portion of surface at the gap between adjacent pixel units, and to form a pattern of a first electrode in the area of each of the pixel units. Only one patterning process is used to form the pattern of the black matrix and the pattern of the first electrode, which simplifies the production process of the array substrate. Also, the pattern of the black matrix having a first concave-convex structure formed on the surface reduces the light intensity of the reflected light produced by external light on the surface of the black matrix, thereby improving the visibility of the area of each of the pixel units of the array substrate.

In at least one embodiment of the present invention, a pattern of a second electrode can be formed on a base substrate prior to conduction of step S201, i.e., forming a pattern of an insulation layer having a second concave-convex structure on a base substrate.

In step S201, while forming a pattern of an insulation layer having a second concave-convex structure on a base substrate, a color filter layer comprising filters of at least three different colors can be formed on the pattern of a second electrode, the filter layer comprising a second concave-convex structure.

Figure 3:
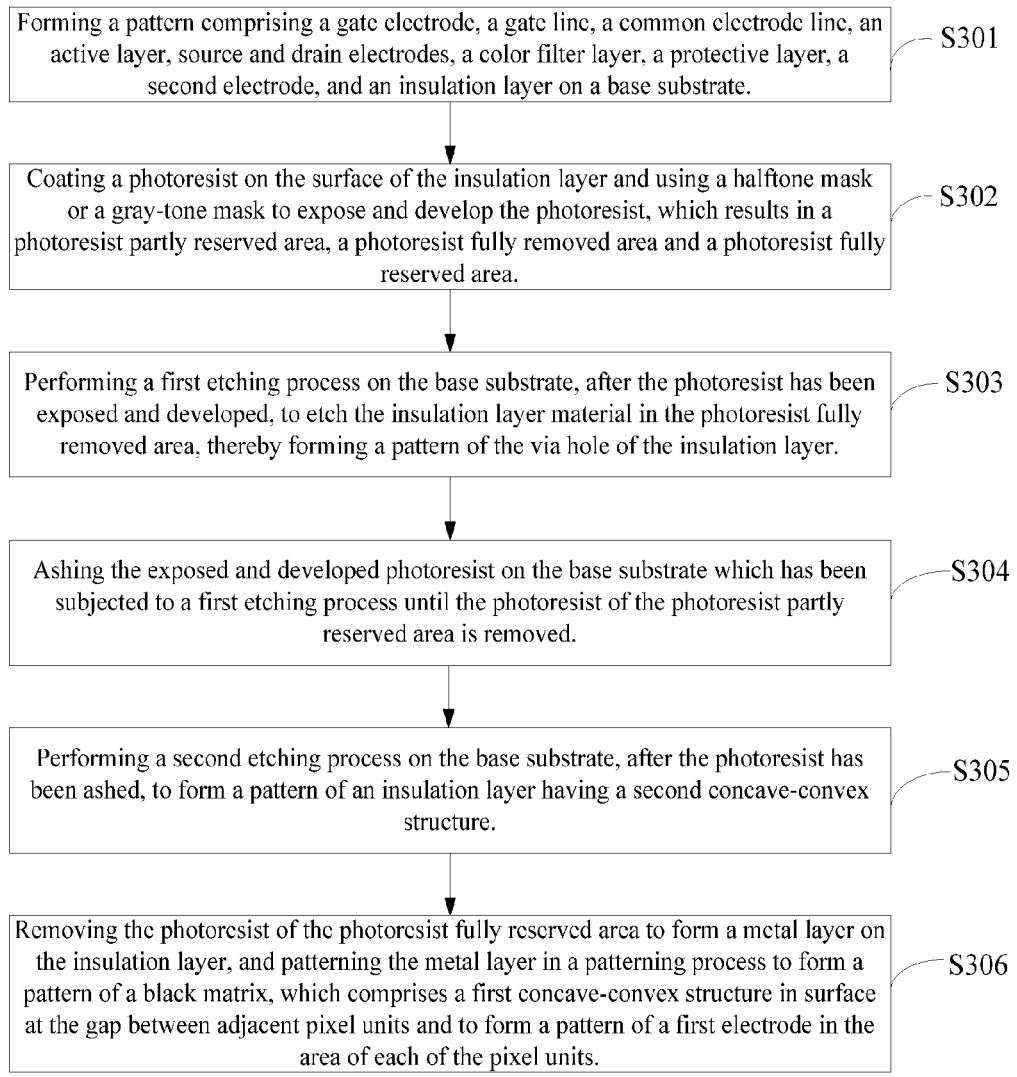
FIG. 3 is a flow chart of a method of manufacturing an array substrate according to an embodiment of the present invention.

The following example is provided to illustrate the method of manufacturing the array substrate as illustrated in FIG. 1a, as illustrated in FIG. 3, the manufacturing method of the example comprises the following steps.

S301. Forming a pattern comprising a gate electrode, a gate line, a common electrode line, an active layer, source and drain electrodes, a color filter layer, a protective layer, a second electrode, and an insulation layer on a base substrate.

Figure 4A:
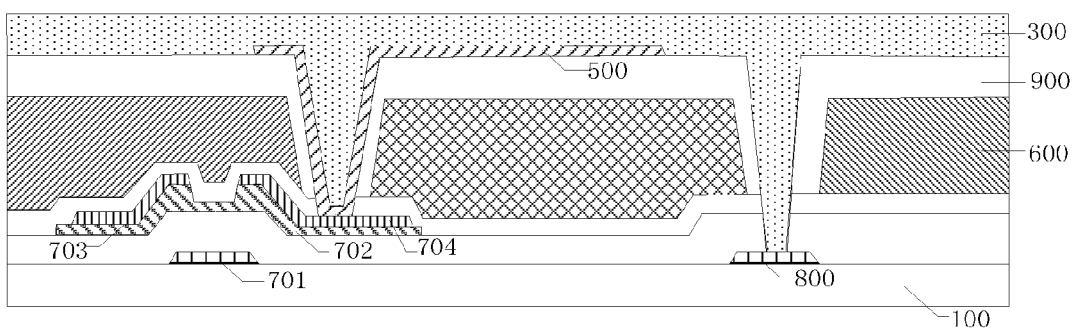
FIG. 4a to FIG. 4f are respectively structural schematic views of various steps carried out in a method of manufacturing an array substrate according to an embodiment of the present invention.

In the process of manufacturing an array substrate, as illustrated in FIG. 4a, a pattern comprising a gate electrode 701, a gate line, a common electrode line 800, an active layer 702, a source electrode 703, a drain electrode 704, a color filter layer 600 and a protective layer 900 is first formed on a base substrate 100, then a pattern of a second electrode 500 is formed on the base substrate with the protective layer 900, the second electrode 500 is electrically connected to the drain electrode 704 via a via hole in the protective layer, and finally a layer of an insulating material is deposited on the base substrate 100 with the second electrode 500, to form a pattern of an insulation layer 300. The gate electrode 701 is electrically connected to, for example, a gate line. The above step can be carried out, for example, by a common patterning process and a film forming process.

S302. Coating a photoresist on the surface of the insulation layer and using a halftone mask or a gray-tone mask to expose and develop the photoresist, which results in a photoresist partly reserved area, a photoresist fully removed area and a photoresist fully reserved area.

Figure 4B:
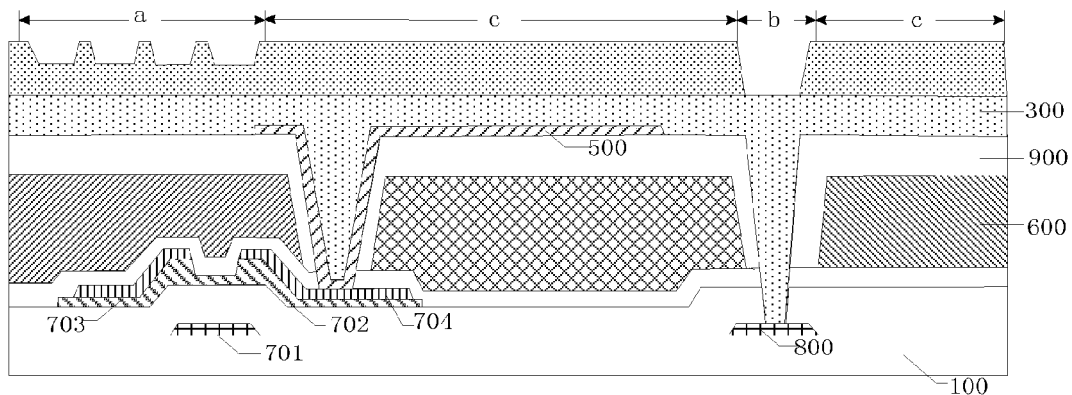

As illustrated in FIG. 4b, a layer of a photoresist is coated on the surface of the insulation layer and a halftone mask or a gray-tone mask is used to expose and develop the photoresist, which results in a photoresist partly reserved area a, a photoresist fully removed area b and a photoresist fully reserved area c.

S303. Performing a first etching process on the base substrate, after the photoresist has been exposed and developed, to etch the insulation layer material in the photoresist fully removed area, thereby forming a pattern of the via hole of the insulation layer.

Figure 4C:
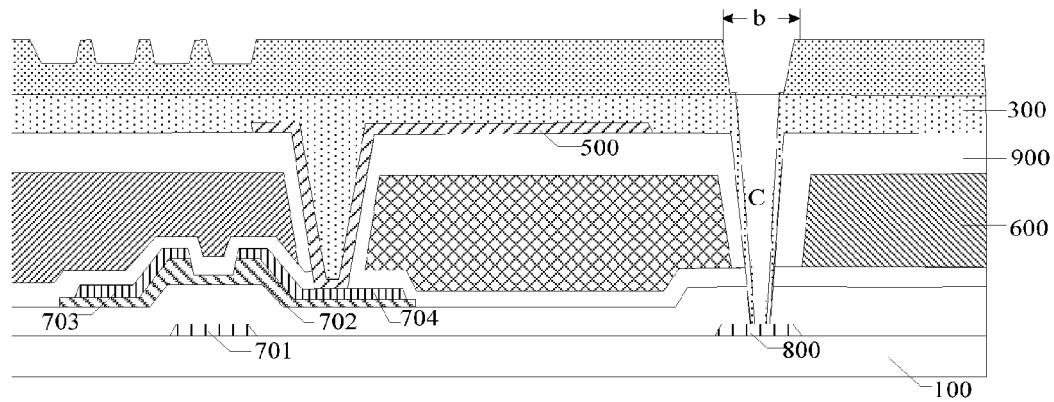

As illustrated in FIG. 4c, a first etching process is carried out on the base substrate 100, after the photoresist has been exposed and developed, to etch the insulation layer material in the photoresist fully removed area b, thereby forming a pattern of the via hole C of the insulation layer 300.

S304. Ashing the exposed and developed photoresist on the base substrate which has been subjected to a first etching process until the photoresist of the photoresist partly reserved area is removed.

Figure 4D:
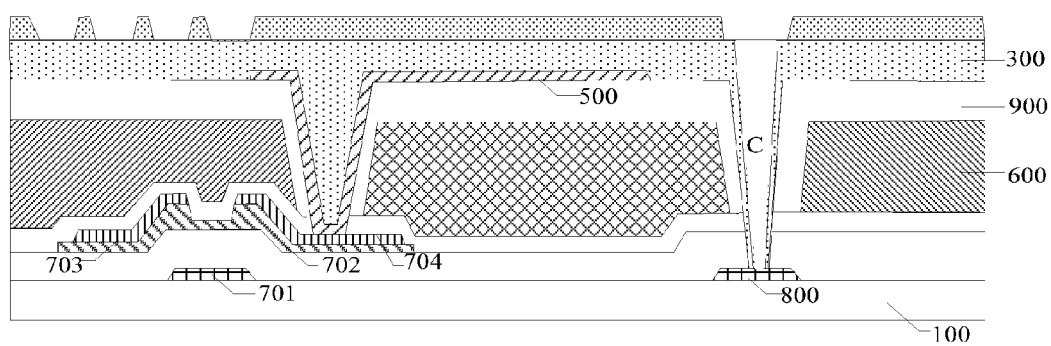

As illustrated in FIG. 4d, it is necessary to ash the exposed and developed photoresist on the base substrate 100 which has been subjected to a first etching process until the photoresist of the photoresist partly reserved area a is removed, whereby the total thickness of the photoresist will be reduced.

S305. Performing a second etching process on the base substrate, after the photoresist has been ashed, to form a pattern of an insulation layer having a second concave-convex structure.

Figure 4E:
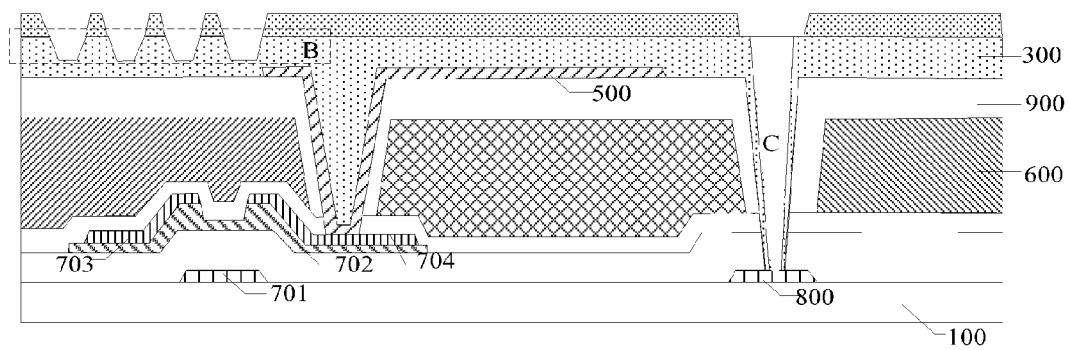

As illustrated in FIG. 4e, a second etching process is carried out on the base substrate 100, after the photoresist has been ashed, to etch part of the insulation layer 300 of the photoresist partly reserved area a, where the thickness etched is less than that of the insulation layer 300, to form a pattern of the insulation layer 300 having a second concave-convex structure B.

S306. Removing the photoresist of the photoresist fully reserved area to form a metal layer on the insulation layer, and patterning the metal layer in a patterning process to form a pattern of a black matrix, which comprises a first concave-convex structure in surface at the gap between adjacent pixel units and to form a pattern of a first electrode in the area of each of the pixel units.

Figure 4F:
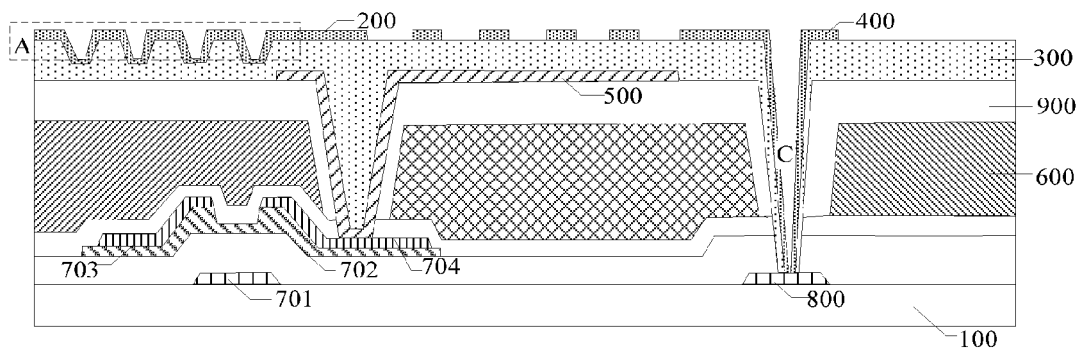

As illustrated in FIG. 4f, the photoresist in the photoresist fully reserved area c is removed first, then a layer of a metal material is deposited on the base substrate on which an insulation layer having a second concave-convex structure is formed to form a metal layer, and the metal layer is then patterned in a patterning process to form a pattern of a black matrix 200 which comprises a first concave-convex structure A in surface at the gap between adjacent pixel units and to form a pattern of a first electrode 400 in the area of each of the pixel units, the first electrode 400 being electrically connected to a common electrode line 800 via a via hole C of the insulation layer 300.

To this end, the above array substrate provided in at least one embodiment of the present invention is manufactured by the above steps S301 to S306.

At least one embodiment of the present invention further provides a display device, comprising the above array substrate provided in at least one embodiment of the present invention, which, for example, can be: any product or component having display function such as a mobile phone, a tablet computer, a TV set, a display, a laptop, a digital photo frame, a navigation system, or the like. Other indispensable components of the display device should be understood by a person of ordinary skill in the art, and thus no more details will be provided herein and they shall not be construed as limitation on the present invention. Reference can be made to the embodiments of the above array substrate for the implementation of the display device, and no more details will be repeated here.

At least one embodiment of the present invention provides an array substrate and its manufacturing method, and a display device. The array substrate comprises a black matrix disposed on a base substrate; the array substrate comprises a plurality of pixel units arranged in an array, the orthographic projection of the pattern of the black matrix on the base substrate at least partially covers the gap between the adjacent pixel units, and the surface of at least a portion of the black matrix comprises a first concave-convex structure capable of reflecting the light irradiated to the surface of the black matrix in diffuse reflection. Because the first concave-convex structure of the surface of the black matrix has a diffuse reflection effect, the external light will be subjected to diffuse reflection when irradiated to the surface of the black matrix, thereby reducing the light intensity of the reflected light, enhancing the visibility of the area of each of the pixel units of the array substrate, and improving the display effect of picture.

The above are merely exemplary embodiments of the present invention, and are not intended to limit the scope of protection of the present invention, which is yet determined by the appended claims.

The present application claims the priority of the Chinese patent application No. 201510004123.7 submitted on Jan. 4, 2015, and the content disclosed in the above Chinese patent application is incorporated herein by reference as part of the present application.

The invention claimed is:

1. An array substrate, comprising:
   a base substrate, a black matrix disposed on the base substrate and an insulation layer disposed below and in direct contact with the black matrix,
      wherein the array substrate comprises a plurality of pixel units arranged in an array, the orthographic projection of the pattern of the black matrix on the base substrate at least partially covers a gap between the adjacent pixel units, and a surface of at least a portion of the black matrix comprises a first concave-convex structure capable of reflecting the light irradiated to the surface of the black matrix in diffuse reflection;
   a surface of the insulation layer comprises a second concave-convex structure matching the first concave-convex structure of the surface of the black matrix; and
   the insulation layer comprises a via hole disposed in an area of each of the pixel units.

2. The array substrate according to claim 1, wherein a material of the black matrix is a metal material.

3. The array substrate according to claim 1, further comprising: a slit-shaped first electrode disposed in the area of each of the pixel units on the base substrate, wherein the first electrode is made of a same material and disposed in the same layer as the black matrix.

4. The array substrate according to claim 1, further comprising: a second electrode disposed in the area of each of the pixel units on the base substrate, wherein the second electrode is insulated from the first electrode via the insulation layer.

5. The array substrate according to claim 4, wherein the second electrode is a planar electrode or a slit electrode.

6. The array substrate according to claim 4, wherein orthographic projections of the first electrode and the second electrode on the base substrate at least partially overlap.

7. The array substrate according to claim 4, wherein the first electrode is a common electrode and the second electrode is a pixel electrode; or the first electrode is a pixel electrode and the second electrode is a common electrode.

8. The array substrate according to claim 1, wherein the insulation layer is a color filter layer comprising filters of at least three different colors.

9. The array substrate according to claim 1, wherein the first concave-convex structure has a width of 3 to 6 microns; and/or
the first concave-convex structure has a depth of 0.5 to 1.5 microns; and/or
the first concave-convex structure has an interval of 3 to 6 microns.

10. A display device comprising the array substrate according to claim 1.

11. A method of manufacturing an array substrate, comprising:
forming a plurality of pixel units arranged in an array on a base substrate and forming a pattern of a black matrix which at least partially covers a gap between adjacent pixel units;
wherein a surface of at least a portion of the pattern of the black matrix comprises a first concave-convex structure capable of reflecting the light irradiated to the surface of the black matrix in diffuse reflection;
forming the pattern of the black matrix on the base substrate comprises:
forming on the base substrate a pattern of an insulation layer which comprises a second concave-convex structure matching the first concave-convex structure and a via hole in an area of each of the pixel units;
forming a metal layer on the insulation layer; and
patterning the metal layer by a patterning process to form the pattern of the black matrix with at least a portion of the surface thereof comprising a first concave-convex structure at the gap between the adjacent pixel units.

12. The method of claim 11, wherein, further comprising the step of:
forming a pattern of a first electrode in an area of each of the pixel units in the patterning process of forming the pattern of the black matrix.

13. The method according to claim 12, comprising:
forming on the base substrate a pattern of a second electrode in the area of each of the pixel units prior to forming on the base substrate the pattern of the insulation layer comprising the second concave-convex structure;
wherein forming on the base substrate the pattern of an insulation layer comprising the second concave-convex structure comprises:
forming a color filter layer comprising filters of at least three different colors on the pattern of the second electrode, the filter layer comprising the second concave-convex structure.

14. The array substrate according to claim 2, wherein a material of the black matrix is a metal material.

15. The array substrate according to claim 2, further comprising: a slit-shaped first electrode disposed in an area of each of the pixel units on the base substrate, wherein the first electrode is made of a same material and disposed in the same layer as the black matrix.

16. The array substrate according to claim 2, further comprising: a second electrode disposed in an area of each of the pixel units on the base substrate, wherein the second electrode is insulated from the first electrode via the insulation layer.

17. The array substrate according to claim 16, wherein the second electrode is a planar electrode or a slit electrode.

18. The array substrate according to claim 2, wherein the insulation layer is a color filter layer comprising filters of at least three different colors.

19. The array substrate according to claim 2, wherein the first concave-convex structure has a width of 3 to 6 microns; and/or
the first concave-convex structure has a depth of 0.5 to 1.5 microns; and/or
the first concave-convex structure has an interval of 3 to 6 microns.

* * * * *